(12) United States Patent
Lee et al.

(10) Patent No.: US 9,876,136 B2
(45) Date of Patent: Jan. 23, 2018

(54) SEPARATION METHOD OF GAN SUBSTRATE BY WET ETCHING

(71) Applicant: GWANGJU INSTITUTE OF SCIENCE AND TECHNOLOGY, Gwangju (KR)

(72) Inventors: Dong-Seon Lee, Gwangju (KR); Duk-Jo Kong, Gwangju (KR); Junyoub Lee, Gwangju (KR); Chang Mo Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/458,576

(22) Filed: Aug. 13, 2014

(65) Prior Publication Data
US 2015/0050762 A1  Feb. 19, 2015

(30) Foreign Application Priority Data
Aug. 14, 2013  (KR) .......................... 10-2013-0096288

(51) Int. Cl.
*H01L 33/00* (2010.01)

(52) U.S. Cl.
CPC ...... *H01L 33/0079* (2013.01); *H01L 33/0075* (2013.01); *H01L 2933/0083* (2013.01)

(58) Field of Classification Search
CPC ........... H01L 31/03044; H01L 31/1856; H01L 33/00; H01L 33/24; H01L 33/005; H01L 33/0079; H01L 33/025; H01L 33/04; H01L 33/06
See application file for complete search history.

(56) References Cited

U.S. PATENT DOCUMENTS

| | | | |
|---|---|---|---|
| 6,252,261 B1 * | 6/2001 | Usui et al. | 257/190 |
| 2009/0283782 A1 * | 11/2009 | Shakuda | H01L 21/02403 257/94 |
| 2013/0228809 A1 * | 9/2013 | Chang et al. | 257/98 |

FOREIGN PATENT DOCUMENTS

| | | | |
|---|---|---|---|
| CN | 101740692 A | * | 6/2010 |
| KR | 1020120099544 A | | 9/2012 |

* cited by examiner

*Primary Examiner* — Michael Jung
*Assistant Examiner* — Mikka Liu
(74) *Attorney, Agent, or Firm* — Hauptman Ham, LLP

(57) ABSTRACT

Disclosed herein is a method of separating a GaN substrate by wet etching. The method employs chemical lift-off, and includes forming oxide layers separated from each other and a GaN column in each space between the oxide layers on a substrate, forming an n-GaN layer covering an upper space on the oxide layers and the n-GaN columns, sequentially forming an active layer, a p-GaN layer, and a p-type electrode on the n-GaN layer, and removing the oxide layers and wet etching the n-GaN columns to separate the substrate. The method can achieve improvement in epitaxial growth of GaN and reduction in fabrication costs through a simple process. In addition, the method can increase a luminous area and light extraction efficiency.

10 Claims, 5 Drawing Sheets

(a)

(b)

(c)

(a)

(b)

(c)

(d)

(a)

(b)

(c)

(d)

SEPARATION METHOD OF GAN SUBSTRATE BY WET ETCHING

CROSS-REFERENCE TO RELATED APPLICATION

This application claims priority to Korean Patent Application No. 10-2013-0096288 filed on 14 Aug., 2013, and all the benefits accruing therefrom under 35 U.S.C. § 119, the contents of which is incorporated by reference in its entirety.

BACKGROUND

1. Technical Field

The present invention relates to a method of separating a GaN substrate by wet etching. Particularly, the present invention relates to a method of separating a GaN substrate, in which n-GaN columns are formed to provide a light emitting diode (LED) structure and are subjected to wet etching using a KOH solution to separate the substrate.

2. Description of the Related Art

Light emitting diodes (LEDs) are semiconductor devices that emit light. With various characteristics such as low power consumption and long lifespan, horizontal type LEDs are used in large color display boards or display screens of mobile phones. However, since the horizontal type LED has an n-type electrode and a p-type electrode formed on the same plane, it is necessary to have a predetermined chip area or higher. Moreover, as the horizontal type LED is fabricated on a sapphire substrate that is an insulator, the horizontal type LED exhibits low brightness in high output operation and is vulnerable to electrostatic shock, thereby providing difficulty in application to general lighting fixtures or vehicle lamps. In recent years, vertical type LEDs overcoming such problems of the horizontal type LEDs are fabricated and used in the art. Vertical type LEDs enable high light output based on good efficiency in heat dissipation and current spreading, and are widely used for high output LEDs.

However, such a typical type LED is fabricated through a laser lift-off process, which requires expensive equipment, thereby causing increase in fabrication costs and a complicated fabrication process. Moreover, in the laser lift-off process, semiconductor layers can be bent due to difference in coefficient of thermal expansion. Therefore, there is a need for novel technology capable of securing productivity.

Korean Patent Publication No. 2012-0099544 A discloses a method of fabricating a vertical type light emitting diode using a wet-etching type buffer layer. In this method, a buffer layer permitting wet etching is interposed between a sapphire substrate and a gallium nitride layer, thereby allowing the sapphire substrate to be removed without laser irradiation. However, in fabrication of a vertical type gallium nitride (GaN)-based LED, there is difficulty in epitaxial growth of GaN due to a large difference between a material for the buffer layer and an n-type semiconductor layer formed on the buffer layer.

BRIEF SUMMARY

It is an aspect of the present invention to provide a method of separating a GaN substrate by wet etching, in which n-GaN columns are formed in fabrication of a vertical type LED having improved brightness and resistance to electrostatic shock to reduce a difference in lattice constant between a GaN-based semiconductor layer and a substrate, thereby securing improved epitaxial growth of GaN while enabling mass production through a simple fabrication process by eliminating costs for laser equipment.

In accordance with one aspect of the present invention, a method of separating a GaN substrate by wet etching includes: forming oxide layers separated from each other and a GaN column in each space between the oxide layers on a substrate; forming an n-GaN layer covering an upper space on the oxide layers and the n-GaN columns; sequentially forming an active layer, a p-GaN layer, and a p-type electrode on the n-GaN layer; and removing the oxide layers and wet etching the n-GaN columns to separate the substrate.

In one embodiment of the invention, the formation of the oxide layers separated from each other and the GaN column in each space between the oxide layers may include: (a) depositing an oxide layer on the substrate or on an n-GaN layer grown on the substrate; (b) forming vertical holes in the oxide layer; and (c) forming n-GaN columns by regrowing the n-GaN layer in the vertical holes.

In another embodiment of the invention, the formation of the oxide layers separated from each other and the GaN column in each space between the oxide layers may include: (a) forming n-GaN columns by etching an n-GaN layer grown on the substrate; and (b) forming an oxide layer in each space between the n-GaN columns through passivation of oxide.

According to the present invention, the method can achieve improvement in epitaxial growth of GaN and reduction in fabrication costs through a simple process. In addition, the method can increase a luminous area and light extraction efficiency.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Embodiments of the invention will now be described in detail with reference to the accompanying drawings. It should be understood that the following embodiments are given by way of illustration only and the present invention is not limited to the following embodiments. Rather, it should be understood that various modifications, variations and alterations can be made without departing from the spirit and scope of the present invention defined by the claims and equivalents thereof.

The present invention relates to a method of separating a GaN substrate using a chemical lift-off process. The method includes: forming oxide layers separated from each other and a GaN column in each space between the oxide layers on a substrate; forming an n-GaN layer covering an upper space above the oxide layers and the n-GaN columns; sequentially forming an active layer, a p-GaN layer, and a p-type electrode on the n-GaN layer; and removing the oxide layers and wet etching the n-GaN columns to separate the substrate.

The kind of substrate may be determined depending upon the kind of semiconductor layer to be grown thereon. Thus, when a gallium nitride semiconductor layer will be grown on the substrate, a sapphire ($Al_2O_3$) substrate having a similar lattice constant thereto is used as the substrate. Sapphire is a crystal with hexa-rhombic (R3c) symmetry and has c-axis and a-axis lattice constants of 13.001 Å and 4.758 Å, respectively. Sapphire has C(0001), A(1120), R(1102) planes, and the like, in which the C plane allows relatively easy growth of a nitride thin film. When there is a large difference in lattice constant between the substrate and a semiconductor layer, crystal defects are generated, thereby causing deterioration in light extraction efficiency.

However, since the GaN-based semiconductor layer and the substrate do not have the exact same lattice constant, there can be a problem of crystal defect. To overcome this problem, typical techniques in the related art propose that a GaN-based semiconductor layer is grown on a buffer layer formed of MN, ZnO, and the like, followed by chemically removing the buffer layer. However, a large difference in lattice constant between the buffer layer formed of MN, ZnO, and the like and the GaN-based semiconductor layer provides difficulty in growth of the GaN-based semiconductor layer on the buffer layer. To solve this problem, according to the present invention, n-GaN micro- or nano-scale columns are formed on the substrate to reduce crystal defects due to a difference in lattice constant in separation of the n-GaN columns and the substrate, while improving epitaxial growth of the GaN-based semiconductor layer. Growth of the GaN-based semiconductor layer may be performed by metal organic chemical vapor deposition (MOCVD), liquid phase epitaxy (LPE), hydride vapor phase epitaxy (HYPE), molecular beam epitaxy (MBE), metal organic vapor phase epitaxy (MOVPE), and the like.

Figure 1:
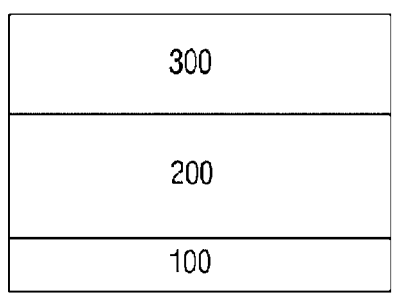
FIG. 1 is a flow diagram illustrating a process of forming n-GaN columns according to one embodiment of the present invention.
Figure 1:
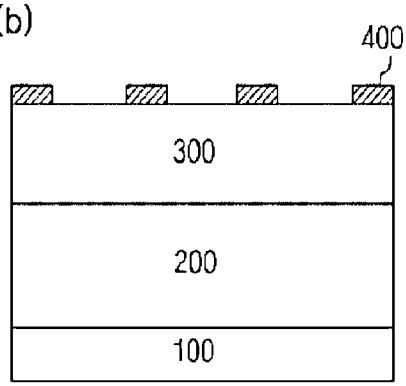
Figure 1:
Figure 1:
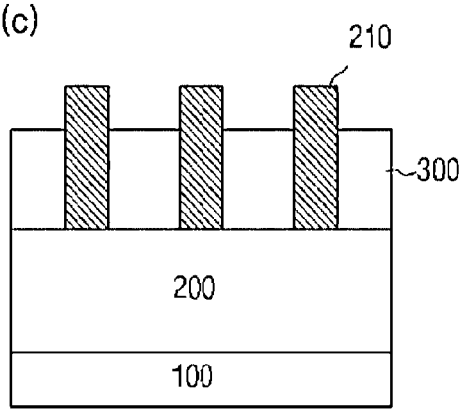

In one embodiment, the process of forming the oxide layers separated from each other and the GaN columns in each space between the oxide layers on the substrate includes: depositing an oxide layer on an n-GaN layer grown on the substrate; forming vertical holes in the oxide layer by a lithography process; and forming the n-GaN columns by re-growing the n-GaN layer in the vertical holes, as shown in FIG. 1

According to the present invention, the n-GaN columns may be formed by vapor-liquid-solid (VLS)-based growth, molecular beam epitaxy (MBE)-based self-alignment growth, or selective area growth (SAG). In selective area growth (SAG) or epitaxial lattice overgrowth (ELO), a region capable of suppressing growth and a region incapable of suppressing growth are repeatedly or selectively formed using a mask. In some embodiments, the n-GaN columns may be formed by SAG or ELO in order to reduce crystal defects due to lattice mismatch between the substrate and the GaN-based semiconductor layer.

Referring to FIG. 1 (a), with an n-GaN layer 200 grown on a substrate 100, an oxide layer 300 such as $SiO_2$ is deposited on the substrate by plasma-enhanced chemical vapor deposition (PECVD). When growing the n-GaN layer 200, Si, Mg and the like may be used as dopants. Generally, Si is added to form an n-type nitride semiconductor layer and Mg is added to form a p-type nitride semiconductor layer. In addition, AlGaN or InGaN may be grown in the substrate instead of the GaN layer. The doping concentration may be determined dependent upon the kind of device to be fabricated and is preferably $1 \times 10^{-1}$ Ωcm or less in order to reduce forward operation voltage. The GaN-based semiconductors can be classified into high resistance and conductive semiconductors according to doping concentration. The GaN-based semiconductor layer may have a total thickness of 1 μm to 20 μm in order to minimize damage to the GaN-based semiconductor layer due to stress upon removal of the substrate.

In the process of forming an oxide layer using $SiO_2$ or SOG to be separated from each other on the substrate 100, $SiO_2$ may be deposited by PECVD or e-beam deposition, and SOG (spin-on-glass) may be deposited by spin-coating. It is important to form the oxide layer having high quality without generating pin holes upon deposition, such that the oxide layer can be substantially prevented from being affected by an etchant and can be used as a protective layer for the GaN-based semiconductor layer in the course of etching the substrate.

Referring to FIG. 1 (b), selective regions are determined on an about 200 nm thick oxide layer 300 to form vertical holes in which n-GaN columns 210 will be grown. The vertical holes may be formed by photolithography, laser interference lithography, or nano imprinting lithography. By way of example, in this embodiment, a photoresist 400 is deposited on the oxide layer 300 to determine the selective regions on the oxide layer 300.

Referring to FIG. 1 (c), the oxide layer 300 in the selective regions is removed by dry etching, such as reactive ion etching (RIE), with $CF_4/O_2$ gas to form the vertical holes above the substrate 100, and the n-GaN layer 200 is regrown in the vertical holes to form n-GaN columns 210. Herein, dry etching may be inductively coupled plasma/reactive ion etching (ICP/RIE) or reactive ion etching (RIE). Generally, in the course of etching the oxide layer 300, a selection ratio is adjusted using a CFx-based polymer and increases with increasing C/F ratio. However, a low pressure high density plasma source has a high degree of dissociation, thereby making it difficult to increase the C/F ratio. Thus, dry etching may be performed using a gas having a high C/F ratio, or may be performed in a downstream area providing a low degree of dissociation.

Figure 2:
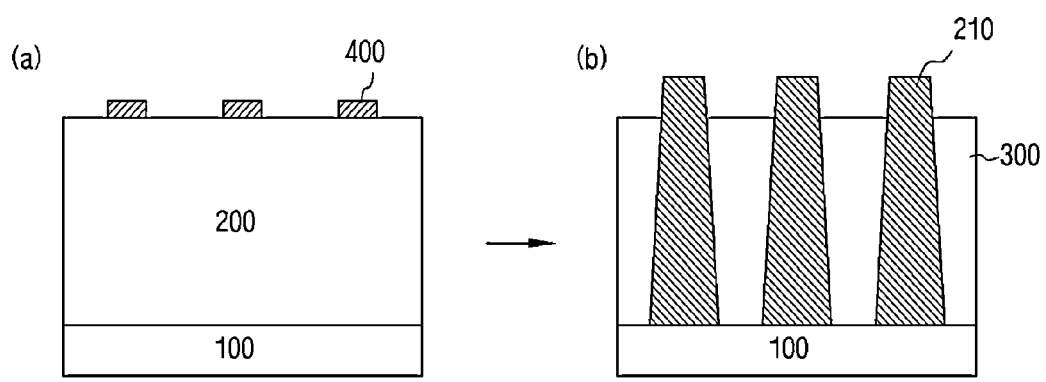
FIG. 2 is a flow diagram illustrating a process of forming n-GaN columns according to another embodiment of the present invention.

In another embodiment, the process of forming the oxide layers separated from each other and the GaN column in each space between the oxide layers on the substrate includes: forming n-GaN columns by etching an n-GaN layer grown on the substrate by a lithography process; and forming an oxide layer in each space between the n-GaN columns through passivation of oxide, as shown in FIG. 2.

Referring to FIG. 2 (a), with an n-GaN layer 200 grown on a substrate 100 by lithography, selection regions are determined on the n-GaN layer 200 to form n-GaN columns 210, and a photoresist 400 is deposited on the selection regions. Referring to FIG. 2 (b), the n-GaN layer 200 in the selection regions, on which the photoresist is deposited, is removed by dry etching such as ICP/RIE to reach an upper side of the substrate 100.

After dry etching, the n-GaN columns 210 are formed in the selection regions, and an oxide layer 300 is formed in each space between the n-GaN columns 210 through passivation of SiO$_2$ or SOG to protect the n-GaN columns 210. The microstructure of the oxide layer (SiO$_2$ or SOG) 300 enhances quality of the GaN-based semiconductor layer by minimizing stress between the substrate 100 and the GaN-based semiconductor layer so as to be used as an etching stop layer upon removal of the substrate 100 by wet etching.

In order to form an n-GaN layer 220 covering an upper space of the oxide layer 300 and the n-GaN columns 210, it is desirable that upper portions of the n-GaN columns 210 be exposed above the oxide layer 300, as shown in FIGS. 1 and 2. Preferably, the microstructure of the oxide layer 300 covering the substrate 100 has a wafer coverage ratio of 90% or less. Generally, when the microstructure of the oxide layer 300 covers the entirety of the substrate 100, the GaN-based semiconductor layer cannot be grown on the oxide layer 300. Thus, in the present invention, the upper portions of the n-GaN columns 210 are partially exposed above the oxide layer 300 to form the n-GaN layer 220 covering the upper space of the oxide layer 300 and the n-GaN columns 210.

Figure 3:
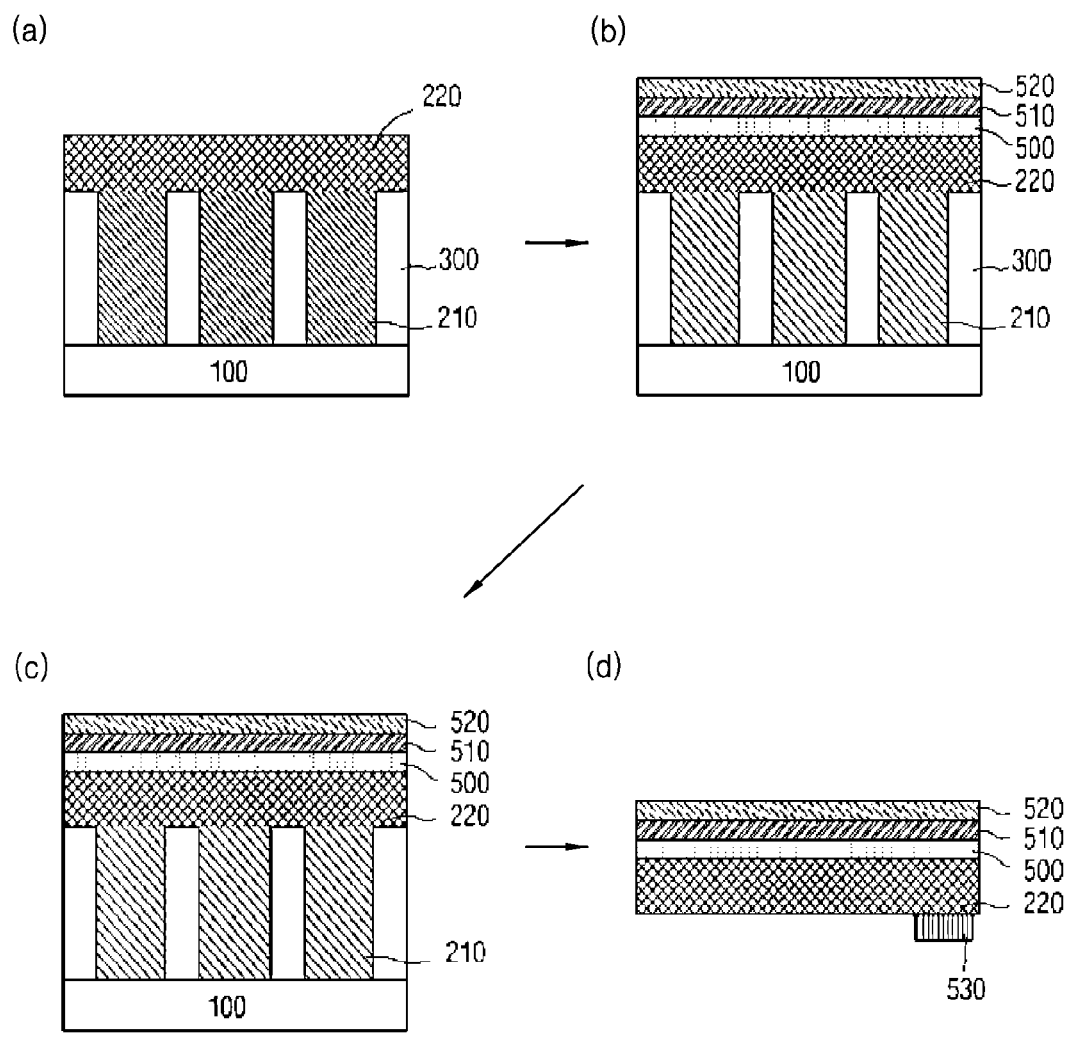
FIG. 3 is a flow diagram illustrating a method of separating a GaN substrate by wet etching of n-GaN columns according to one embodiment of the present invention.

As shown in FIG. 3 (a), the n-GaN layer 220 covering the upper space of the oxide layer 300 and the n-GaN columns 210 is grown after depositing n-GaN on the n-GaN columns 210 formed on the substrate 100 using TMG (trimethyl gallium) and NH$_3$ by MOCVD at about 1050° C. The n-GaN layer 220 is formed to be connected to the n-GAN columns 210, whereby crystal defects due to a difference in lattice constant between the substrate 100 and the n-GaN layer 200 can be reduced in the course of growth of the n-GaN layer 220 on the n-GaN columns 210. Then, the n-GaN columns 210 are finally removed, thereby securing improved epitaxial growth of the n-GaN layer 220.

Referring to FIG. 3 (b), in operation of sequentially forming an active layer 500, a p-GaN layer 510, and a p-type electrode 520 on the n-GaN layer 220, the active layer 500 is formed to have a multi-quantum well (MQW) structure, and the p-GaN layer 510 and the p-type electrode 520 are formed by MOCVD (Metal Organic Chemical Vapor Deposition), MBE (Molecular Beam Epitaxy), or HVPE (Hydride Vapor Phase Epitaxy).

The active layer 500 serves to activate light emission and is formed of a material having a lower energy band-gap than those of the n-type semiconductor and p-type semiconductor layers. In this embodiment, the active layer 500 may be formed of an InAlGaN-based compound semiconductor that has a lower band-gap than that of GaN. That is, the active layer may have a single quantum well structure or a multi-quantum well structure composed of barrier layers of In$_x$(Al$_y$Ga$_{1-y}$)N and well layers of In$_x$(Al$_y$Ga$_{1-y}$)N, in which the compositional ratios of In, Ga and Al can be adjusted to provide various LEDs including LEDs having an InN (~2.2 eV) band-gap to emit light of long wavelengths and LEDs having an MN (~6.4 eV) band-gap to emit light of short wavelengths. In operation of separating the substrate through removal of the oxide layer 300 and wet etching of the n-GaN columns 210, separation of the substrate is achieved by chemical lift-off, thereby reducing fabrication costs as compared with a substrate separation process using an expensive KrF excimer laser, preventing damage to the GaN layer at a higher temperature than a critical sublimation temperature of gallium due to heat generation upon laser irradiation, and preventing current leakage by reverse bias at a damaged surface. In addition, separation of the substrate by chemical lift-off according to this embodiment enables omission of a process of removing gallium droplets after laser separation, thereby ensuring economic feasibility through reduction in the number of and time for fabrication processes. However, a typical method for separating the substrate by wet-etching the GaN layer in chemical lift-off has problems of damage to a semiconductor layer grown on the substrate in the course of wet etching and low etching efficiency of an etchant with respect to the GaN layer having a planar lattice structure on the substrate.

In this operation, the oxide layer 300 may be removed using HF or buffered oxide etchant (BOE), as shown in FIG. 3 (c).

After the oxide layer 300 is removed, the substrate 100 may be removed from the n-GaN columns 210 by wet etching the n-GaN columns 210 in a 3~7 mol KOH solution at 60~70° C. for 20~30 minutes. The KOH solution serves to activate etching of GaN at a corner of GaN or in a region at which crystal defects are concentrated, thereby facilitating wet etching of the n-GaN columns Wet etching using the KOH solution will be described below in more detail with reference to FIG. 5.

Referring to FIG. 3 (d), a vertical type LED is fabricated by depositing an n-type electrode 530 on a lower side of the n-GaN layer 220, from which the substrate 100 has been removed. To achieve low contact resistance and high reflectivity, the p-type electrode and the n-type electrode may be formed by depositing one material selected from the group consisting of Pd, Rh, Pt, Ta, Ni, Cr, Au, Ti, and alloys thereof so as to increase external quantum efficiency.

According to the present invention, operation of forming the n-GaN layer 220 includes growing the n-GaN layer 220 to form a convex-concave portion having a micro- or nano-pyramidal structure. The convex-concave portion having a micro- or nano-pyramidal structure may form a photonic crystal structure. SAG on the GaN template generally has a pyramidal structure composed of semi-polar planes. The photonic crystal structure refers to a structure in which media having different indices of refraction are regularly arranged like crystals, and enables adjustment of an emission wavelength in multiples of a primary emission wavelength, thereby improving light extraction efficiency.

Generally, luminous efficacy of a luminous plane is inversely proportional to current density thereof.

Figure 4:
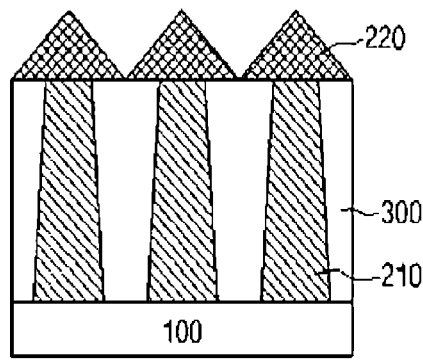
FIG. 4 is a flow diagram illustrating a method of separating a GaN substrate by wet etching of n-GaN columns according to another embodiment of the present invention.
Figure 4:
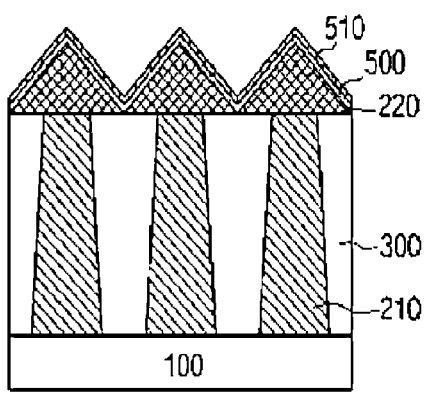
Figure 4:
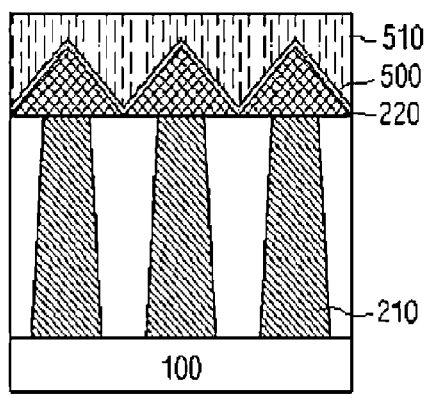
Figure 4:
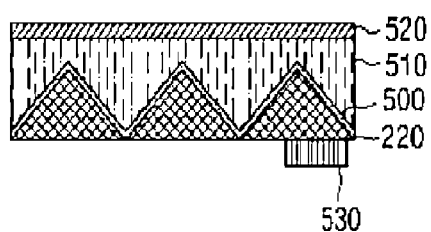

In growth of the n-GaN layer 220 to form the convex-concave portion having a micro- or nano-pyramidal structure, the n-GaN layer 220 is regrown to have a micro- or nano-pyramidal structure using structural features of a crystal plane, as shown in FIG. 4 (a).

As shown in FIG. 4 (b), when the active layer 500 and the p-GaN layer 510 are sequentially grown on the n-GaN layer 220, the active layer 500 and the p-GaN layer 510 can be grown in a convex-concave shape of a micro- or nano-pyramidal structure. Here, the n-GaN layer 220 may be grown to form a planar semiconductor layer without the convex-concave portion, as shown in FIG. 3 (d), or may be grown to form a semiconductor layer in a convex-concave shape, as shown in FIG. 4 (b). When the n-GaN layer 220 is grown to form the semiconductor layer in the convex-concave shape as shown in FIG. 4 (b), the active layer 500 formed in the convex-concave shape and emitting light has a larger area than in the case in which the active layer is formed in a planar structure, thereby improving light extraction efficiency through increase in luminous area and surface roughness. After the n-GaN layer, the active layer, and the p-GaN are sequentially grown in the convex-concave shape, lateral growth of the p-GaN layer 510 occurs to yield a flat surface as shown in FIG. 4 (c) such that the p-type electrode 520 can be deposited thereon. In this way, according to the present invention, the vertical type LED as shown in FIG. 4 (d) can be fabricated by separating the substrate by removing the oxide layer 300 and wet-etching the n-GaN columns 210, followed by depositing the n-type electrode 530 on the lower side of the n-GaN layer 220.

Figure 5:
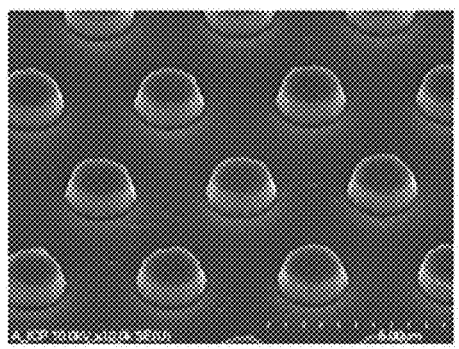
FIG. 5 shows (a) an image of GaN micro-columns after ICP etching, (b) an image of GaN micro-columns 5 minutes after KOH wet etching, and (c) an image of GaN micro-columns after ICP etching, and (d) an image of GaN micro-columns 7 minutes after KOH wet etching.
Figure 5:
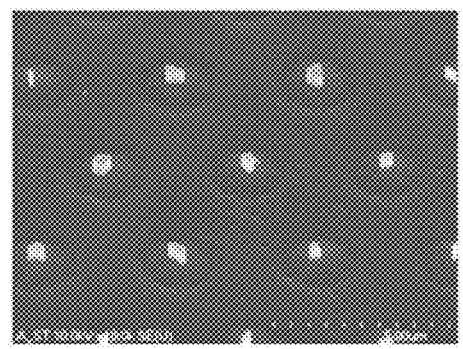
Figure 5:
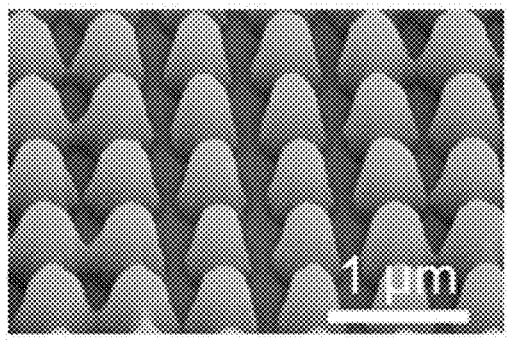
Figure 5:
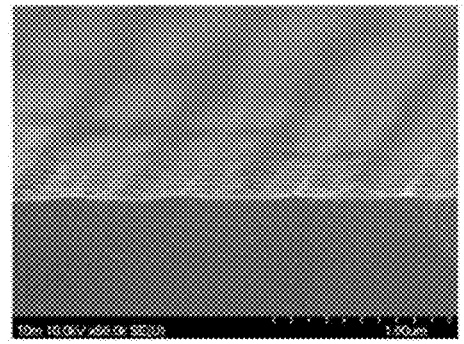

FIG. 5 provides images of n-GaN micro- or nano-columns in the course of KOH wet etching in one example of the present invention. In FIG. 5, (a) is an image of n-GaN micro-columns formed immediately after ICP etching, in which side surfaces of the columns have a semi-polar lattice structure. It could be seen that, when the n-GaN micro-columns was subjected to wet etching in a KOH solution, the diameter of the semi-polar lattice structure was gradually decreased to form a non-polar lattice structure over time, and the non-polar lattice structure was also gradually decreased in diameter over time and was changed to a structure, as shown in FIG. 5 (b), 5 minutes after wet etching in the KOH solution. In addition, unlike the side surfaces of the n-GaN columns, since c-planes corresponding to upper sides of the n-GaN columns were not substantially affected by wet etching, it could be confirmed that only the side surfaces of the n-GaN columns were selectively removed by wet etching with the KOH solution. In FIG. 5, (c) is an image of n-GaN nano-columns formed after ICP etching in which side surfaces of the columns have a semi-polar lattice structure like the columns as shown in FIG. 5 (a). It could be seen that, when the n-GaN nano-columns were subjected to wet etching in the KOH solution for 7 minutes, most of the n-GaN nano-columns were removed by wet etching, as shown in FIG. 5 (d). In a typical chemical lift-off process for separating the n-GaN layer from the substrate, since the n-GaN layer is grown in a planar shape or in a patterned stripe shape, there is a problem of substantially long etching time due to a wide area to be etched and low activation efficiency of an etchant with respect to the planar structure. To solve such a problem, in the method according to the present invention, based on optical characteristics of wet etching using the KOH solution with respect to GaN, the n-GaN layer having a planar lattice structure capable of improving etching efficiency of the KOH solution and the n-GaN columns having a much smaller diameter (micro or nano-scale) than the existing n-GaN layer are arranged, thereby securing a rapid processing time through reduction of etching time. to In addition, since c-planes corresponding to the upper sides of the n-GaN columns are not affected by wet etching with the KOH solution, the n-GaN columns have a constant height, thereby improving epitaxial growth of the n-GaN layer on the n-GaN columns Although some embodiments have been described herein, it should be understood by those skilled in the art that these embodiments are given by way of illustration only and the present invention is not limited thereto. It should be understood by those skilled in the art that various modifications, variations and alterations can be made without departing from the spirit and scope of the present invention. The scope of the present invention should be defined by the appended claims and equivalents thereof.

What is claimed is:

1. A method of separating a GaN substrate by wet etching, comprising:
   forming oxide layers separated from each other and an n-GaN column in each space between the oxide layers on a substrate;
   forming an n-GaN layer covering an upper space on the oxide layers and the n-GaN column in each space, wherein an upper side of the oxide layers and the n-GaN column is in contact with the n-GaN layer and an under side of the oxide layers and the n-GaN column is in contact with the substrate, and the n-GaN layer is grown in a convex-concave shape having a pyramidal structure;
   sequentially forming an active layer, a p-GaN layer, and a p-type electrode on the n-GaN layer; and
   removing the oxide layers and wet etching the n-GaN column in each space between the removed oxide layers to separate the substrate.

2. The method of separating a GaN substrate by wet etching according to claim 1, wherein the oxide layers separated from each other on the substrate are formed of $SiO_2$ or SOG.

3. The method of separating a GaN substrate by wet etching according to claim 2, wherein the oxide layers are formed on the substrate by depositing $SiO_2$ through plasma-enhanced chemical vapor deposition (PECVD) or e-beam (electron beam) deposition.

4. The method of separating a GaN substrate by wet etching according to claim 1, wherein, in removing the oxide layers and wet etching the n-GaN column, removal of the oxide layers is performed using a buffered oxide etchant (BOE) or HF solution.

5. The method of separating a GaN substrate by wet etching according to claim 2, wherein the oxide layers are formed on the substrate by depositing SOG through spin-coating.

6. The method of separating a GaN substrate by wet etching according to claim 1, wherein, in removing the oxide layers and wet etching the n-GaN column, wet etching of the n-GaN column is performed using a KOH solution.

7. The method of separating a GaN substrate by wet etching according to claim 6, wherein the KOH solution has a concentration of 3 moles to 7 moles, and wet etching is performed for 20 minutes to 30 minutes.

8. The method of separating a GaN substrate by wet etching according to claim 1, further comprising:
   depositing an oxide layer on the substrate;
   forming vertical holes in the oxide layer; and
   forming the n-GaN column in the vertical holes in the oxide layer.

9. The method of separating a GaN substrate by wet etching according to claim 8, wherein the forming vertical holes in the oxide layer is performed by photolithography, laser interference lithography, or nano-imprinting lithography.

10. A method of separating a GaN substrate by wet etching, comprising:
    forming a first n-GaN layer on a substrate;
    forming n-GaN columns by etching the first n-GaN layer;
    forming oxide layers in each space between the n-GaN columns through passivation of oxide;
    forming a second n-GaN layer covering an upper space on the oxide layers and the n-GaN columns, wherein an upper side of the oxide layers and the n-GaN columns is in contact with the second n-GaN layer and an under side of the oxide layers and the n-GaN columns is in contact with the first n-GaN layer;
    sequentially forming an active layer, a p-GaN layer, and a p-type electrode on the second n-GaN layer; and
    removing the first n-GaN layer and the oxide layers, and wet etching the n-GaN columns to separate the substrate, wherein the second n-GaN layer has a bottom surface substantially planar after the wet etching.

* * * * *